United States Patent
Melai et al.

(10) Patent No.: US 8,173,511 B2
(45) Date of Patent: May 8, 2012

(54) METHOD OF MANUFACTURING A SEMICONDUCTOR DEVICE AND SEMICONDUCTOR DEVICE OBTAINED WITH SUCH A METHOD

(75) Inventors: Joost Melai, Enschede (NL); Erwin Hijzen, Blanden (BE); Philippe Meunier-Beillard, Kortenberg (BE); Johannes Josephus Theodorus Marinus Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 365 days.

(21) Appl. No.: 12/094,303

(22) PCT Filed: Oct. 29, 2006

(86) PCT No.: PCT/IB2006/053996
§ 371 (c)(1),
(2), (4) Date: Mar. 9, 2010

(87) PCT Pub. No.: WO2007/057803
PCT Pub. Date: May 24, 2007

(65) Prior Publication Data
US 2010/0289022 A1    Nov. 18, 2010

(30) Foreign Application Priority Data
Nov. 21, 2005   (EP) ..................... 05110997

(51) Int. Cl.
  *H01L 21/331* (2006.01)
  *H01L 21/8222* (2006.01)
(52) U.S. Cl. ........................................ 438/313
(58) Field of Classification Search .................... 257/51; 438/131, 313, 600
  See application file for complete search history.

(56) References Cited

U.S. PATENT DOCUMENTS

| 2001/0051413 A1* | 12/2001 | Chantre et al. ............... 438/364 |
| 2005/0215021 A1 | 9/2005 | Chantre et al. |
| 2005/0218399 A1* | 10/2005 | Magnee et al. ................ 257/19 |

FOREIGN PATENT DOCUMENTS

| EP | 1132955 A1 | 9/2001 |
| WO | 03100845 A1 | 12/2003 |
| WO | 2005013350 A1 | 2/2005 |

* cited by examiner

Primary Examiner — Anthony Ho (57) ABSTRACT

The invention relates to a method of manufacturing a semiconductor device (10) with a substrate (11) and a semiconductor body (12) which is provided with at least one bipolar transistor having an emitter region (1), a base region (2) and a collector region (3), wherein in the semiconductor body (12) a first semiconductor region (13) is formed that forms one (3) of the collector and emitter regions (1,3) and on the surface of the semiconductor body (12) a stack of layers is formed comprising a first insulating layer (4), a polycrystalline semiconductor layer (5) and a second insulating layer (6) in which stack an opening (7) is formed, after which by non-selective epitaxial growth a further semiconductor layer (22) is deposited of which a monocrystalline horizontal part on the bottom of the opening (7) forms the base region (2) and of which a polycrystalline vertical part (2A) on a side face of the opening (7) is connected to the polycrystalline semiconductor layer (5), after which spacers (S) are formed parallel to the side face of the opening (7) and a second semiconductor region (31) is formed between said spacers (S) forming the other one (1) of the emitter and collector regions (1,3). According to the invention the above method is characterized in that before the further semiconductor layer (22) is deposited, the second insulating layer (6) is provided with an end portion (6A) that viewed in projection overhangs an end portion (5A) of the underlying semiconductor layer (5). In this way bipolar transistor devices can be obtained with good high frequency properties in a cost effective manner.

11 Claims, 9 Drawing Sheets

METHOD OF MANUFACTURING A SEMICONDUCTOR DEVICE AND SEMICONDUCTOR DEVICE OBTAINED WITH SUCH A METHOD

The invention relates to a method of manufacturing a semiconductor device with a substrate and a semiconductor body which is provided with at least one bipolar transistor having an emitter region, a base region and a collector region, wherein in the semiconductor body a first semiconductor region is formed that forms one of the collector and emitter regions and on the surface of the semiconductor body a stack of layers is formed comprising a first insulating layer, a polycrystalline semiconductor layer and a second insulating layer in which stack an opening is formed, after which by nonselective epitaxial growth a further semiconductor layer is deposited of which a monocrystalline horizontal part on the bottom of the opening forms the base region and of which a polycrystalline vertical part on a side face of the opening is connected to the polycrystalline layer, after which spacers are formed parallel to the side face of the opening and a second semiconductor region is formed between said spacers forming the other one of the emitter and collector regions. The invention also relates to a semiconductor device obtained with such a method.

Such a method is very suitable for making semiconductor devices comprising a bipolar transistor such as a discrete bipolar transistor device but in particular ICs (=Integrated Circuit) comprising a bipolar transistor such as Bi(C)MOS (=Bipolar (Complementary) Metal Oxide Semiconductor) ICs.

A method as mentioned in the opening paragraph is known from WO 03/100845 wherein a manufacturing process of a bipolar transistor is described in which a first semiconductor region comprising the collector region is formed in a semiconductor body as a part of an epitaxial n-type layer on a semiconductor substrate. On top of the semiconductor body a stack of layers is formed comprising a first insulating layer, a polycrystalline semiconductor layer and a second insulating layer. In the stack an opening is formed and by a non-selective (differential) epitaxial growth process a further semiconductor layer in the form of a p-type polycrystalline silicon layer is deposited over the structure. The further semiconductor layer has a horizontal part that is monocrystalline on the bottom of the opening which forms the base region of the transistor and which is connected by vertical parts that are polycrystalline to the polycrystalline semiconductor layer forming the base connection region. Subsequently spacers on the sidewall of the opening are formed by deposition of an insulating layer after which the opening and the structure are filled and covered with other insulating material. CMP (=chemical mechanical polishing) is then used to remove the upper horizontal parts of the insulating layer and of the further semiconductor layer. After removal of the insulating material from within the opening, the top face of the polycrystalline vertical parts of the further semiconductor layer is provided with an insulating region by for example an oxidation step. The spacers are then provided with an "L" shape by depositing a further layer shaped insulating material and by etching back the horizontal parts thereof. Then, by etching a bottom part of the insulating layer between the L-shaped spacers, an emitter opening is formed. A second semiconductor region is formed between the spacers, which region forms the emitter region of the bipolar transistor. The transistor obtained with this method has good high frequency properties, because of the use of a mixed crystal of silicon and germanium in the base region and the very small dimensions of various regions in the thickness direction.

A drawback of such a method is that the yield is relatively low which increases the costs of the process.

It is therefore an object of the present invention to avoid the above drawback and to provide a method, which is suitable for the manufacturing of semiconductor devices comprising transistors that have very high $f_{max}$ (i.e. the maximum frequency for power gain) and $f_A$, (i.e. the maximum frequency for voltage gain) and which is very cost effective.

To achieve this, a method of the type described in the opening paragraph is characterized in that before the further semiconductor layer is deposited, the second insulating layer is provided with an end portion that viewed in projection overhangs an end portion of the underlying semiconductor layer. In this way, the overhanging portion provides space for the polycrystalline vertical part of the further semiconductor layer. This implies that the upper part thereof is covered with a part of the second insulating layer. Thus no separate formation of an insulating region on top of the vertical parts of the further semiconductor layer is needed, which makes the method according to the invention simple and cost effective. The process remains self-aligned and allows for small lateral dimensions and thus the transistor obtained will have a good high-frequency behavior. In this respect an important advantage of the use of an overhanging portion of the second insulating layer is that it is also possible to form—at least a part of—the spacers below these portions. Finally, a very important advantage of the method according to the invention is that a critical process step like CMP is no longer necessary since a wet or dry etch technique may be used to remove the upper horizontal and vertical parts of the insulating layer and of the further semiconductor layer. This makes the method according to the invention very robust resulting in a high yield and low cost of the devices obtained.

The overhanging portion of the second insulating layer may be formed in several ways, for example by reducing the size of the opening at the position of the second insulating layer or by increasing the size of the opening at the position of the polycrystalline semiconductor layer.

In a preferred embodiment of a method according to the invention the second insulating layer is provided with the overhanging end portion by removing, after formation of the opening, a part of the semiconductor layer that faces the opening. One way to obtain the desired result is to laterally oxidize the end portion of the polycrystalline semiconductor layer and to remove the resulting oxide by an etchant based on hydrogen fluoride. In such case the first and second insulating layers may comprise silicon nitride which is hardly etched by such an etchant. Since the nature of a semiconductor layer and an insulating layer is rather different, various selective etching agents may alternatively be applied to obtain the same result. The etching can be done in time.

In accordance with the above, a further preferred embodiment is characterized in that the lateral size of the overhanging portion and the thickness of the further semiconductor layer are chosen such that the vertical part of the further semiconductor layer is formed below the overhanging portion of the second insulating layer.

Preferably, at least a part of the spacers is formed below the overhanging portion. With a method according to the invention the complete spacer can be formed easily below the overhanging end portion.

In an advantageous embodiment after deposition of the further semiconductor layer a sacrificial layer, such as for example a further insulating layer, is deposited that covers the structure and completely fills the opening, the upper parts of the sacrificial layer are removed by planarization after which the remaining horizontal (and upper vertical) polycrystalline portions of the further semiconductor layer are removed by etching and subsequently the sacrificial layer is removed by etching. Although CMP can be used as a planarization step, the use of a wet or dry etching step is preferred in accordance with the invention.

Advantageously the other one of the emitter and collector regions is formed by depositing another semiconductor layer which is patterned by photolithography and etching. This allows for in particular a T-shaped emitter (connection) region which is also favorable for the high-frequency behavior of the transistor.

In an another set of preferred embodiments the region below the overhanging portion is laterally filled with the vertical polycrystalline part of the further semiconductor layer which part subsequently is partly etched back by an etchant that etches polycrystalline material selective with respect to monocrystalline material thus recreating an overhanging portion of the second insulating layer. In this way, the emitter region can be localized by the vertical parts of the further semiconductor layer while still overhanging portions will be available to allow for positioning of (part of) the spacers below these overhanging portions. In these modifications the emitter region can be formed in the same growth process as the one used to form the further semiconductor layer. This is of course very cost effective. Moreover, by said selective etching step in which also the upper horizontal and vertical parts of the further semiconductor layer are removed, at the same time all polycrystalline parts of the another semiconductor layer used to form the emitter region are removed. Thus, the final result is as in the first set of embodiments that the vertical part of the further semiconductor layer is separated from the emitter region by the spacer. However, whereas in the first set of embodiments the spacers are formed before the emitter region is formed, the latter is formed before the former in this second set of embodiments.

In accordance with the above, in a preferred modification of the above set of embodiments, immediately after the non-selective epitaxial growth of the further semiconductor layer, another semiconductor layer is deposited by non-selective epitaxial growth, having a horizontal monocrystalline portion forming the other one of the emitter and collector regions and having remaining polycrystalline portions. Preferably the remaining polycrystalline portions of the another semiconductor layer are removed by the same selective etching step used to etch back the vertical polycrystalline part (and upper horizontal and vertical parts) of the further semiconductor layer.

Preferably spacers are formed by an isotropic deposition of another insulating layer followed by etching back the horizontal parts of said another insulating layer.

In a further embodiment the first semiconductor region forms the collector region and the second semiconductor region forms the emitter region. Although the invention is applicable to so-called collector-up device, the preferred structure is emitter up. For the semiconductor material of various regions silicon or a mixed crystal comprising silicon may be used. Best results are obtained in the silicon material system wherein a mixed crystal of silicon and germanium is preferred for the further semiconductor layer. Although an NPN transistor is superior in speed characteristics, a PNP transistor can be used as well depending on the application.

Finally, the present invention also comprises a semiconductor device obtained by a method according to the invention.

These and other aspects of the invention will be apparent from and elucidated with reference to the embodiments described hereinafter, to be read in conjunction with the drawing, in which.

The Figures are diagrammatic and not drawn to scale, the dimensions in the thickness direction being particularly exaggerated for greater clarity. Corresponding parts are generally given the same reference numerals and the same hatching in the various Figures.

Figure 1:
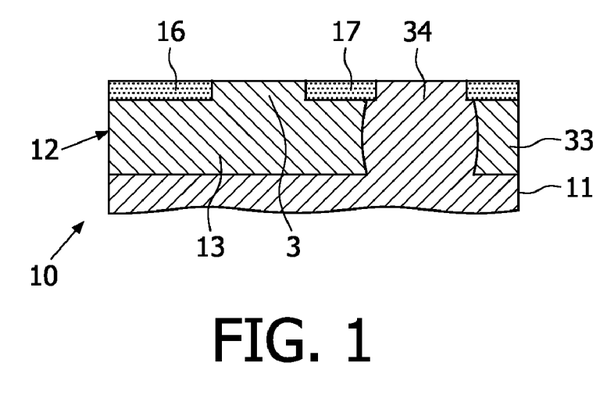
FIGS. 1 through 14 are sectional views of a semiconductor device with a bipolar transistor at various stages in its manufacture by means of a first embodiment of a method in accordance with the invention.
Figure 2:
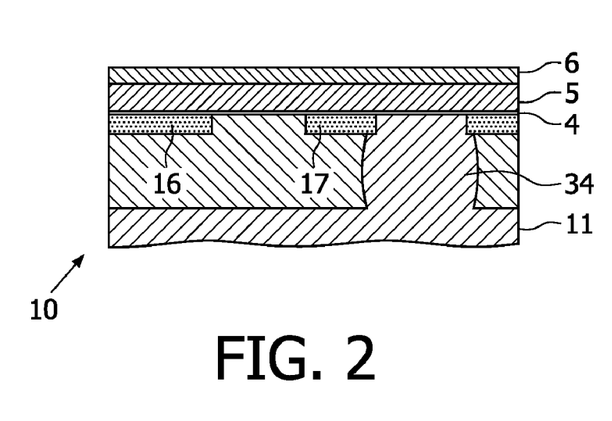
Figure 3:
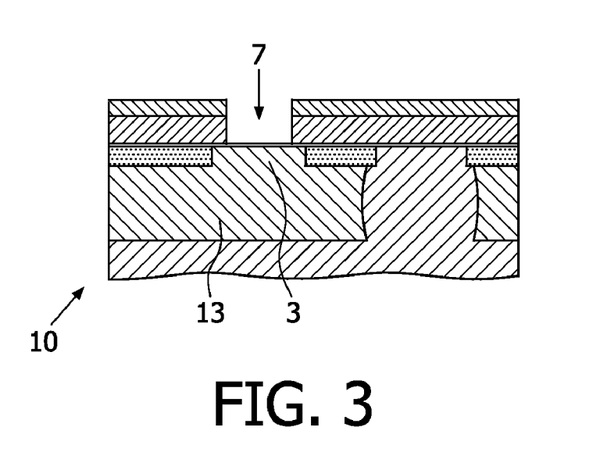
Figure 4:
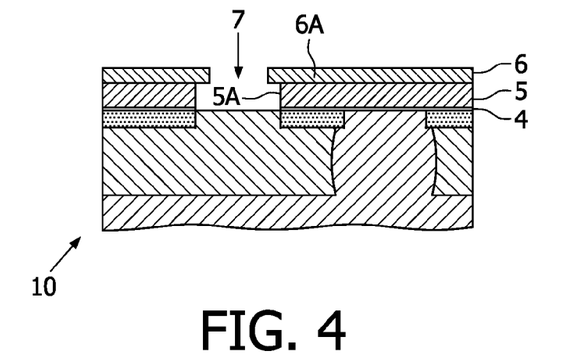
Figure 5:
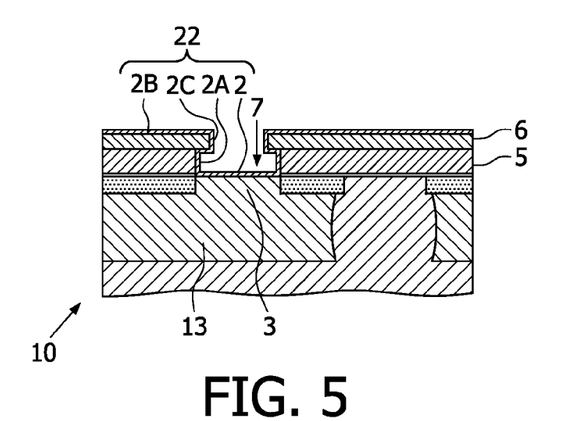
Figure 6:
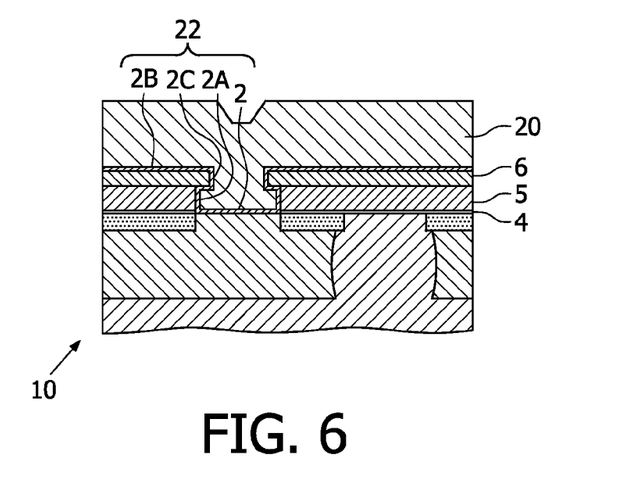
Figure 7:
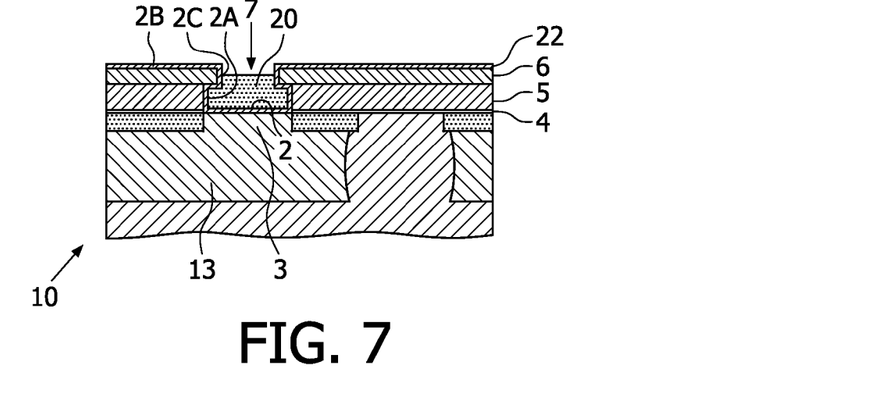
Figure 8:
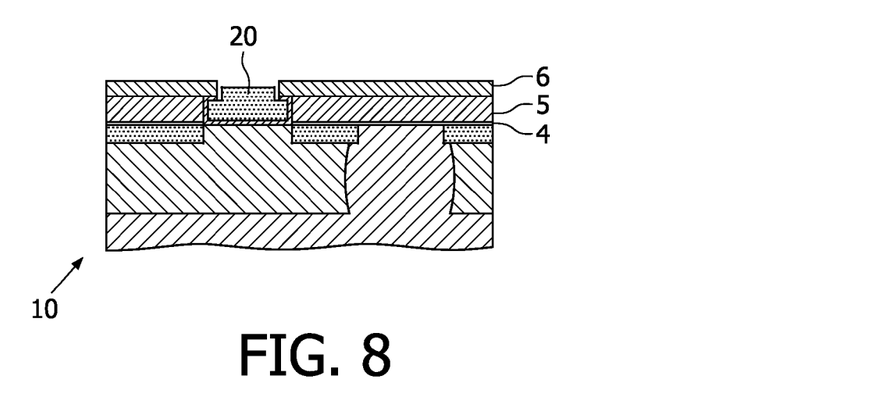

FIGS. 1 through 14 are sectional views of a semiconductor device at various relevant stages in its manufacture by means of a first embodiment of a method in accordance with the invention. The semiconductor device to be manufactured may contain already at the stage in advance of FIG. 1 other semiconductor elements that may have been formed in a usual manner. Such element may be for example a field effect transistor.

In a first relevant step of the manufacture of the device 10 (see FIG. 1) an n-type silicon substrate 11 forming a silicon semiconductor body 12 is provided with an p-type epitaxial layer 33 in which an n-type so-called sinker region 34 is formed as well as a device isolation structure, here in the form of STI (=Shallow Trench Isolation) regions 16,17 comprising silicon dioxide.

Subsequently (see FIG. 2) a thin first insulating layer 4 of silicon dioxide is deposited using thermal oxidation followed by the deposition of a polycrystalline semiconductor layer 5 of silicon that is deposited by CVD (=Chemical Vapor Deposition). Said layer 5 can be $p^{++}$ doped silicon or it can be an undoped or lightly doped gate polysilicon layer of a BiCMOS process. On top of said polysilicon layer 5 a second insulating layer 6 is deposited, here of silicon nitride, for example by CVD. In this example the layers 4,5,6 are about 5 nm, 100 nm and 100 nm thick respectively.

Next (see FIG. 3) a window 7 is formed in the layer structure by means of photolithography and etching, stopping on the thin oxide layer 4. The width of the opening 7 is in this example about 500 nm.

Subsequently (see FIG. 4) layer 6 is provided with an end portion 6A, overhanging an end portion 5A of the polysilicon layer 5, by under etching the polycrystalline silicon layer 5 using an isotropic polysilicon etch. The width of the overhanging end portion 6A of layer 6 is in the order of 100 nm. During said under etching the silicon semiconductor body 12 is protected against etching by the thin silicon dioxide layer 4.

Next (see FIG. 5) a further semiconductor layer 22 is deposited on the structure, in this example a heavily p-type doped silicon layer which is deposited by an epitaxial growth process. The further semiconductor layer 22 further comprises not only silicon but preferably, as in this example, a mixed crystal of silicon and germanium which is doped by a boron spike and it comprises also a thin upper part that is undoped and free of germanium which functions as a capping layer. The further semiconductor layer 22 comprises a monocrystalline part 2 that will form the base region 2 of the transistor, a (first) vertical part 2A that is polycrystalline and that connects the base region 2 to the polycrystalline silicon layer 5 and further small horizontal and vertical parts 2C and a larger horizontal part 2B that are all of a polycrystalline nature. The thickness of the silicon layer 22 is in this example about 30 nm.

Now (see FIG. 6) a thick insulating layer 20 is deposited on the structure, here in the form of a silicon dioxide layer.

This layer 20 is (see FIG. 7) etched back, preferably by means of wet or dry etching process until upper vertical parts 2C of the further semiconductor layer 22 are reached. Thus the etching proceeds until a portion of the smaller part ("the neck") of the opening 7 is exposed. In order to improve the accuracy back-etch may be preceded by an oxide CMP.

Next (see FIG. 8) vertical upper parts 2C and upper horizontal parts 2B of further semiconductor layer 22 are removed by (selective) etching. In this example a dry polysilicon etch is used that is selective towards the insulating layer 20 and the underlying layer, for example the second insulating layer 6 comprising silicon nitride.

The next step (see FIG. 9) comprises the removal of the remainder of insulating layer 20 by etching, either wet or dry, but in any case isotropic such that regions of layer 20 below the overhanging end portion 6A of the second insulating layer 6 are removed as well.

Figure 9:
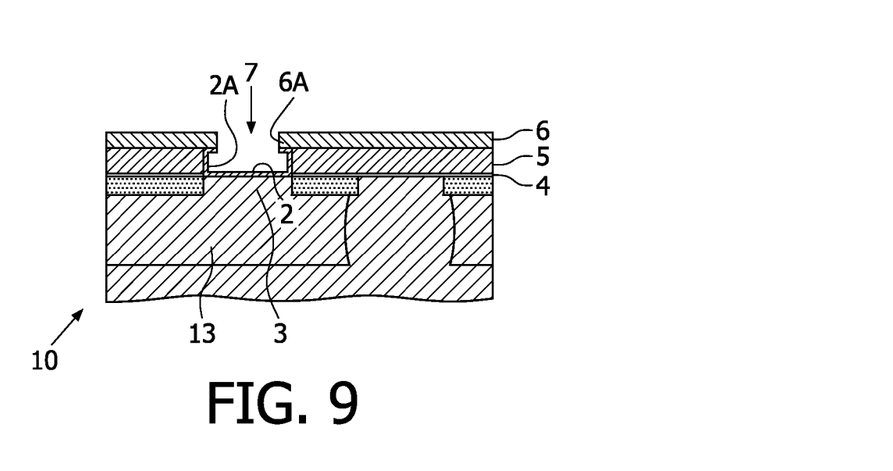
Figure 10:
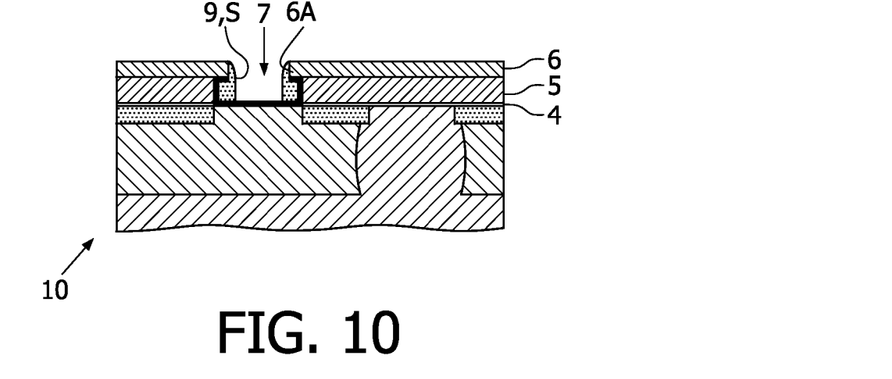
Figure 11:
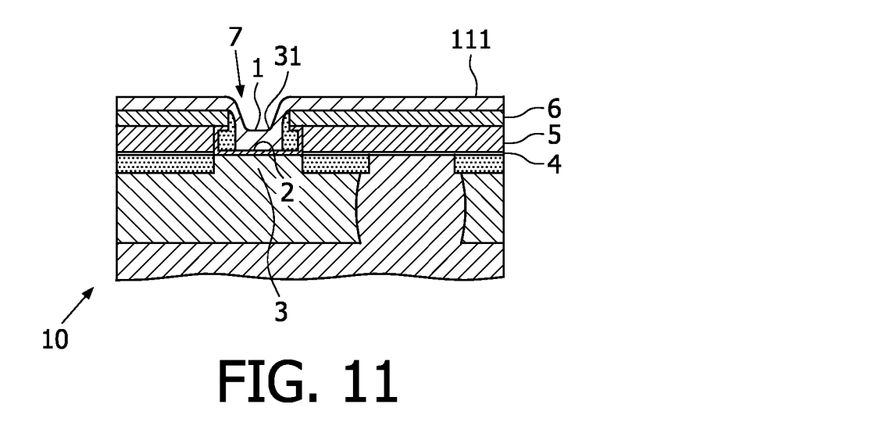
Figure 12:
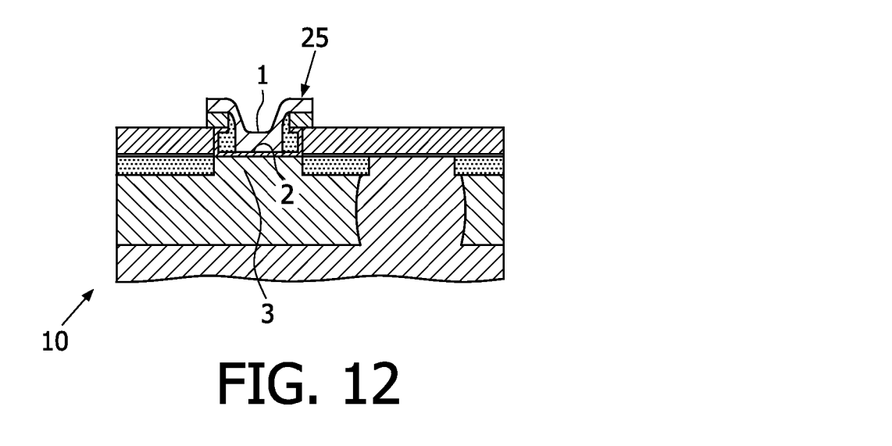
Figure 13:
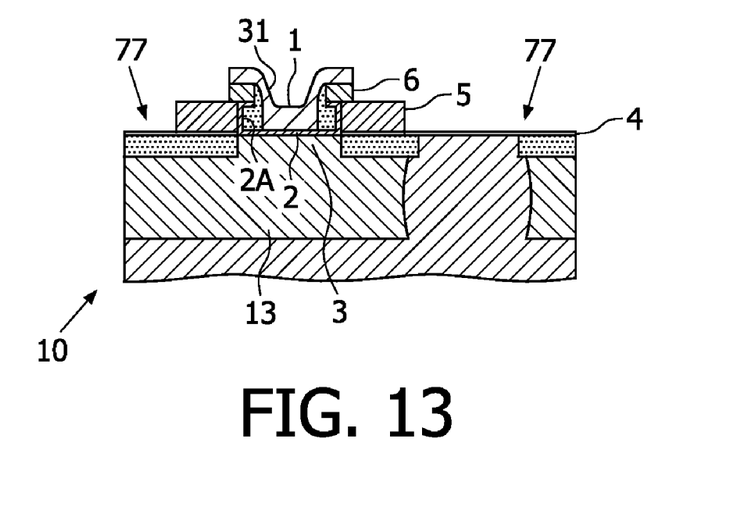
Figure 14:
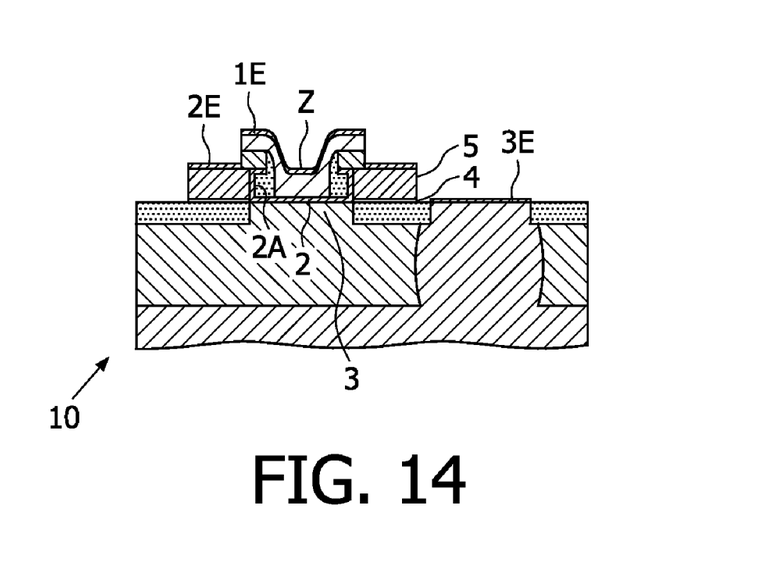
Figure 15:
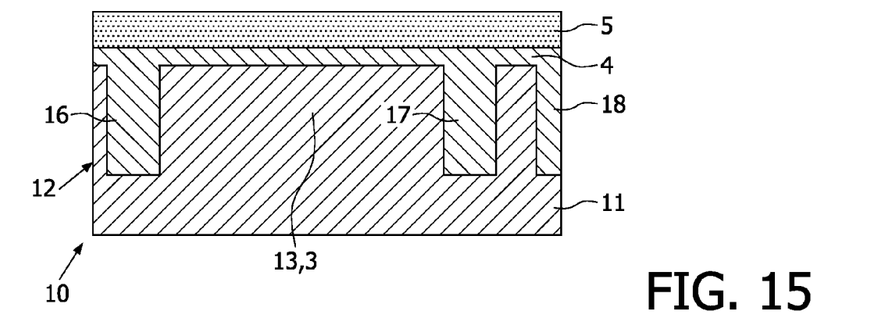
FIGS. 15 through 26 are sectional views of another semiconductor device with a bipolar transistor at various stages in its manufacture by means of a second embodiment of a method in accordance with the invention.
Figure 16:
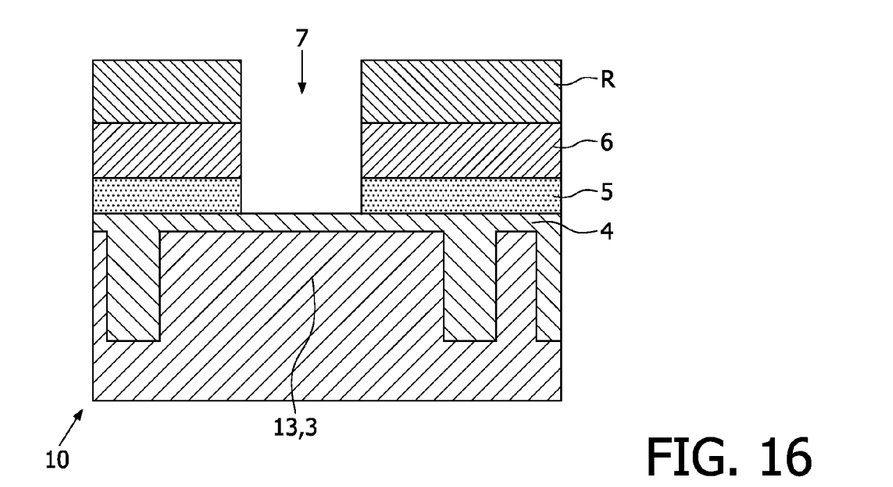
Figure 17:
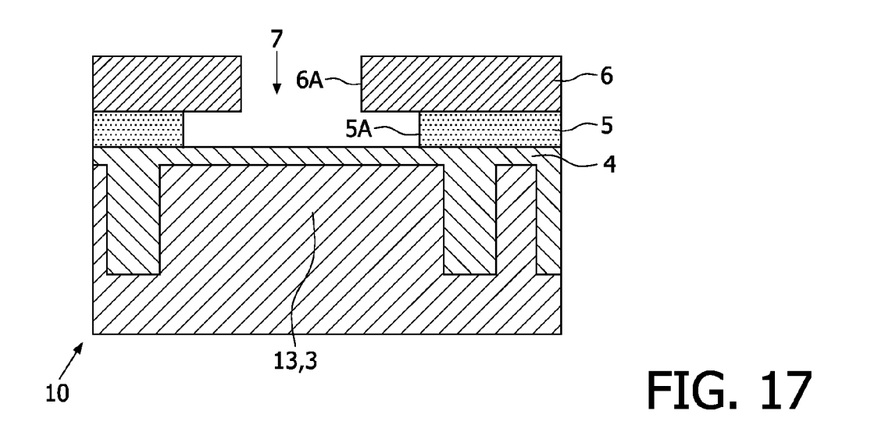
Figure 18:
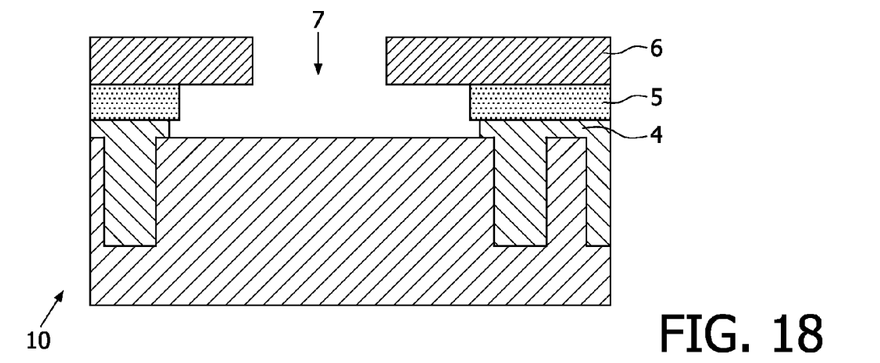
Figure 19:
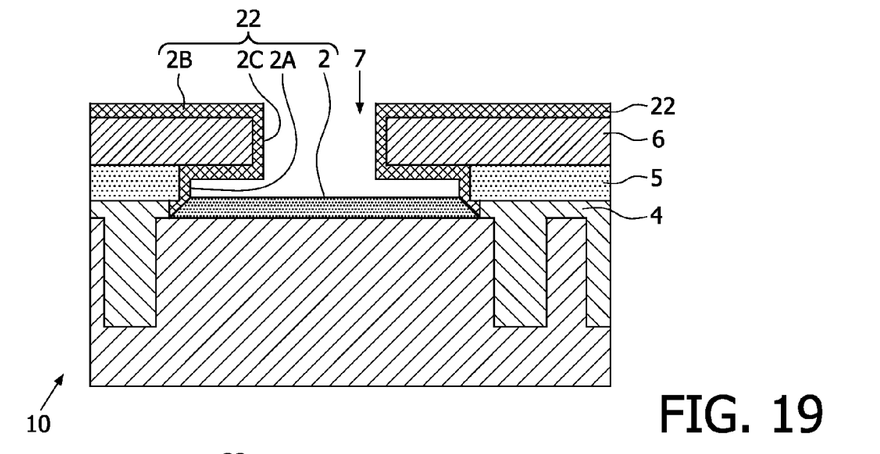
Figure 20:
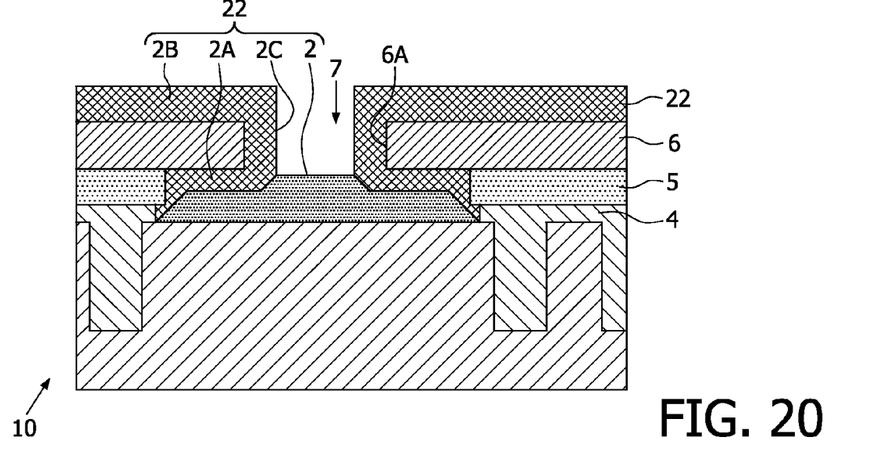
Figure 21:
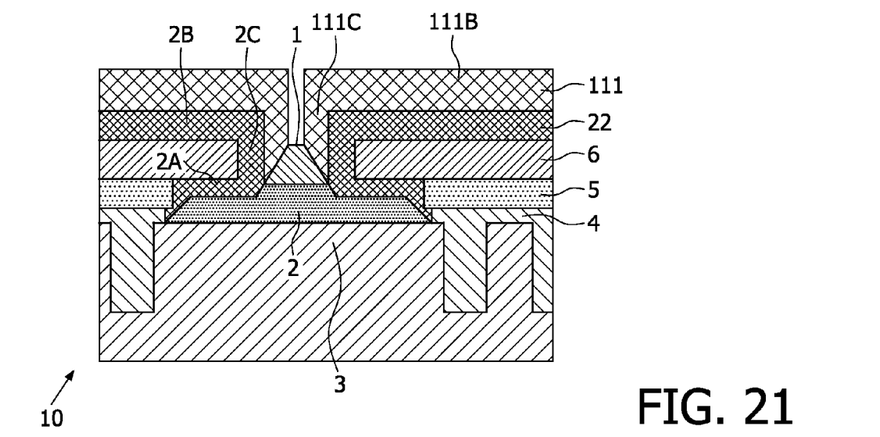
Figure 22:
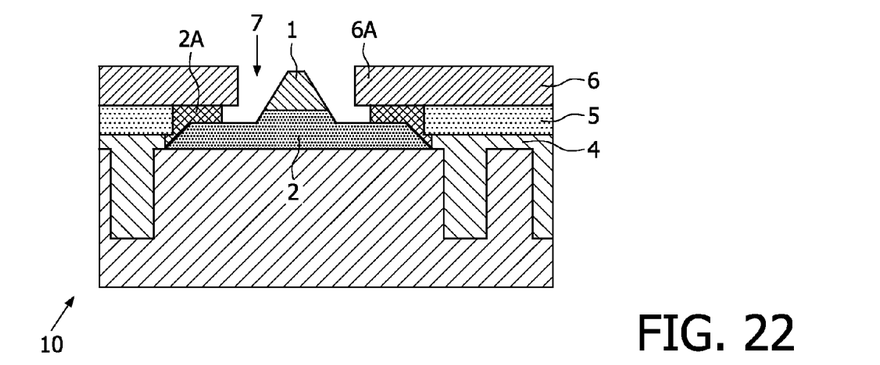
Figure 23:
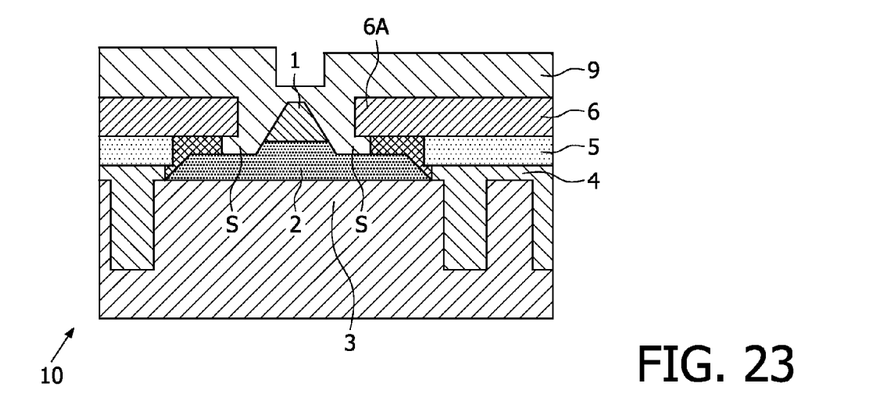
Figure 24:
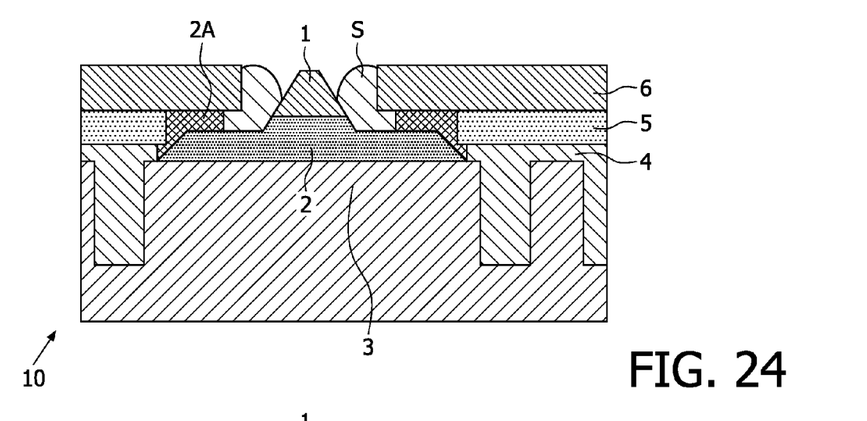
Figure 25:
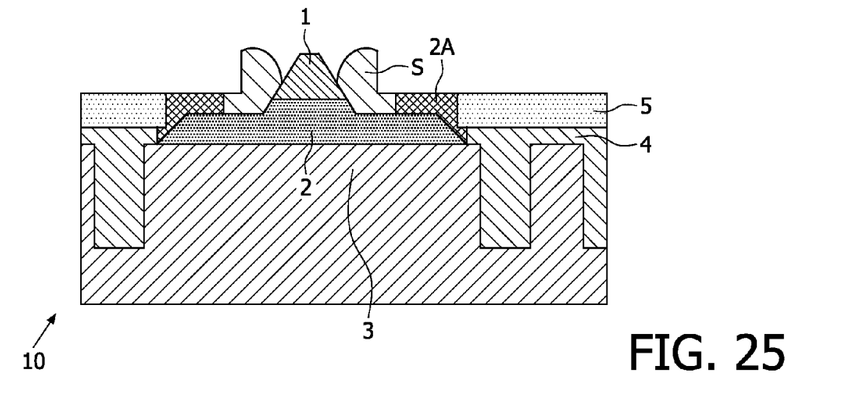

Alternatively the latter parts can be used as (parts of) the spacers to be formed. In that case a non-isotropic etch is used to remove the parts of the insulating layer 20 that viewed in projection are within the neck of the window 7. However, the method described in the previous paragraph is preferred.

Subsequently (see FIG. 10) another insulating layer 9 is uniformly deposited and then the horizontal parts of said layer 9 are removed by etching. As a result spacers S are formed below the outmost part of overhanging end portion 6A of the second insulating layer 6.

After this step (see FIG. 11) another semiconductor layer 111 is deposited over the structure of which a part within window 7 forms a second semiconductor region 31 that is used to form an emitter region 1 of the bipolar transistor. The layer comprises silicon, is deposited by CVD or epitaxy and is in this example about 100 nm thick. In case region 31 is monocrystalline, said region may directly form the emitter region 1. If the region 31 is polycrystalline, the emitter region 1 may be formed by out diffusion of n-type impurities from said layer 111 into the base region 2.

Next (see FIG. 12) the polycrystalline silicon layer 111 is patterned using photolithography and etching forming a T-structure 25 which provides for a low emitter contact resistance while the emitter region 1 itself may be comparatively small. Before this an optional RTA (=Rapid Thermal Anneal) step may be performed to activate all dopants. If the emitter region 1 is monocrystalline, it might already be activated during growth. In that case the RTA step may be done before the emitter growth. An advantage of the T-structure 25 is that the emitter region 1 effectively can have a small width, which is good for device performance (lower base resistance, higher speed) while a wide emitter contact area is beneficial for the manufacturability of the device 10 because the contact lithography has to land on this area. The upper parts of the insulating layer 6 outside said T-structure 25 are removed as well in this example by photolithography and (dry) etching. This etching isolates the base layers of different transistors and opens up the collector contact areas that are underneath it.

Hereinafter (see FIG. 13) parts of the layer structure are provided with openings 77 for configuring contacting possibilities for base and collector region 2,3. The oxide region on top of the collector contact area is removed, preferably by a wet etch step.

Finally (see FIG. 14), emitter, base and collector regions are provided with connection regions comprising for example pads of a silicide (salicide) or of a metal like aluminum. The latter may be deposited and patterned subsequently. In this example salicide regions 1E,2E,3E are formed contacting emitter, base and collector 1,2,3 respectively. Individual devices 10 that are suitable for mounting are obtained after applying a separation technique like etching or sawing.

In the case of a full BiCMOS process the CMOS part is preferably executed partly (the gate part) before and partly (the source/drain part) after the bipolar part is finished but before salicidation and back-end. The example features a grown collector drift region on top of a buried $n^{++}$ sub-collector that is connected from the top with a sinker implant. This collector construction is preferred for high performance BiCMOS/bipolar devices. A low-cost collector architecture is also possible. The drift region and sub-collector can be implanted (using high energy implants) eliminating the costly epitaxial collector growth step.

These kind of cost-reductions may be applied to a method according to the invention for forming the bipolar transistor. Device isolation can be achieved in various ways, depending on the required performance and cost. Possible are—apart from STI regions—DTI (=Deep Trench Isolation), junction isolation and full dielectric isolation using SOI (=Semiconductor On Isolator) substrates.

FIGS. 15 through 26 are sectional views of another semiconductor device at various relevant stages in its manufacture by means of a second embodiment of a method in accordance with the invention. Again, the semiconductor device to be manufactured may contain already at the stage in advance of FIG. 15 other semiconductor elements or parts of such elements that may have been formed in a usual manner. Such an element may be for example a field effect transistor. It is to be noted that for the size and the thickness of various regions or layers, values may be selected that are equal or similar to corresponding values of the first example.

In a first relevant step of the manufacture of the device 10 (see FIG. 15) an n-type silicon substrate 11 forming a silicon semiconductor body 12 is provided with isolation regions here in the form of STI isolation regions 16,17,18. On top of this structure a thin first insulating layer 4 is provided by thermal oxidation and on top of said oxide layer 4 a polycrystalline semiconductor layer 5 of p-type silicon is deposited by CVD. A part of the semiconductor body 12 between said STI region 16,17,18 forms a first semiconductor region 13 that forms (a part of) the collector region 3 of the transistor to be formed.

Next (see FIG. 16) a second insulating layer 6 is deposited, here of silicon nitride, for example by CVD on top of the polysilicon layer 5. On top of the second insulating layer 6 a photoresist mask R is deposited and patterned by photolithography. With the resist R as a mask an opening 7 is formed in the layer structure by means of photolithography and etching, stopping on the thin oxide layer 4.

Subsequently (see FIG. 17) resist mask R is removed and layer 6 is provided by an end portion 6A, overhanging an end portion 5A of the polysilicon layer 5, by under etching the polycrystalline silicon layer 5 using an isotropic polysilicon etch. The width of the overhanging end portion 6A of layer 6 is in the order of 100 nm. During said under etching, the silicon semiconductor body 12 is protected against an attack by the thin silicon dioxide layer 4.

Subsequently (see FIG. 18) a part of the thin insulating layer 4 that borders the opening 7 is removed by etching. The silicon dioxide of layer 4 is etched in an HF based etchant.

Next (see FIG. 19) a further semiconductor layer 22 is deposited on the structure, here a heavily p-type doped silicon layer which is deposited by an epitaxial growth process. The layer 22 further comprises not only silicon but preferably, as in this example, a mixed crystal of silicon and germanium which is doped by a boron spike and it comprises also a thin upper part that is undoped and free of germanium and that functions as a capping layer. The further semiconductor layer 22 comprises a monocrystalline part 2 that will form the base region 2 of the transistor, a (first) vertical part 2A that is polycrystalline and that connects the base region 2 to the polycrystalline silicon layer 5 and further small horizontal and vertical parts 2C and a larger horizontal part 2B that are all of a polycrystalline nature. The thickness of the silicon layer 22 is in this example about 70 nm.

In the final stage (see FIG. 20) of the growth process in which layer 22 is deposited, the space below the overhanging end portion 6A of the second insulating layer 6 is completely filled by layer 22.

Thereinafter (see FIG. 21) the growth process is continued with the deposition of another semiconductor layer 111, here of n-type silicon. A central part of this layer 111 which is on top of (mono) crystalline base region 2 is monocrystalline as well and forms an epitaxial emitter region 1 of the transistor to be formed. Other parts 111B,111C of the layer 111 that are on top of the polysilicon parts 2B,2C of layer 22 are of a polycrystalline nature as well.

Next (see FIG. 22) the polycrystalline parts 2B,2C,111B, 111C of the further semiconductor layer 22 and the another semiconductor layer 111 are removed by a HCl based selective etch of poly-silicon towards mono-silicon. This process is continued towards a stage in which the end portion 6A of the second insulating layer 6 again forms an overhanging portion.

Hereinafter (see FIG. 23) another insulating layer 9 is deposited, here of silicon dioxide, that fills the cavity below the overhanging end portion 6A of second insulating layer 6 as well as the remaining part of opening 7.

Horizontal parts (see FIG. 24) of said layer 9 are removed by etching. As a result spacers S are formed below the outmost part of the overhanging end portion 6A of the second insulating layer 6.

After this step (see FIG. 25) the remaining parts of the second insulating layer 6 are removed by wet etching using for example hot phosphoric acid.

Hereinafter (see FIG. 26) parts of the layer structure are provided with openings 40 in order to for example define the extrinsic base.

Figure 26:
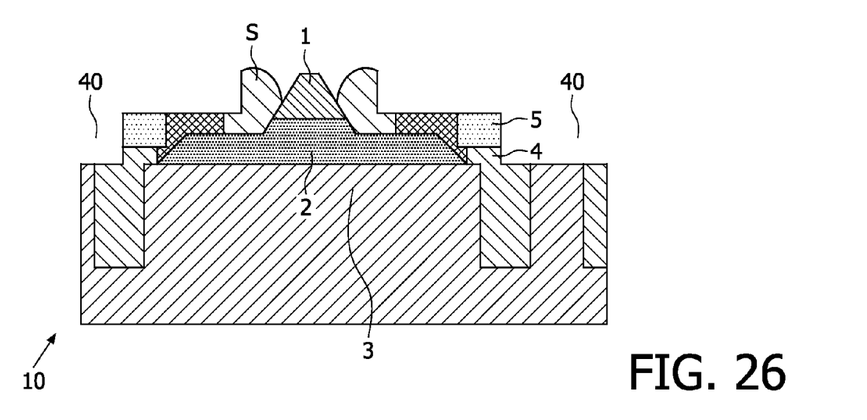

Finally emitter, base and collector regions are provided with connection regions comprising for example pads of a silicide (salicide) or of a metal like aluminum. The latter may be deposited and patterned subsequently. Individual devices that are suitable for mounting are obtained after applying a separation technique like etching or sawing. These steps are not shown in the drawing.

It will be obvious that the invention is not limited to the examples described herein, and that within the scope of the invention many variations and modifications are possible to those skilled in the art.

For example it is to be noted that the invention is not only suitable for the manufacture of a discrete device like a transistor but in particular for the manufacture of ICs like (C)MOS or BI(C)MOS ICs but also bipolar ICs.

Furthermore it is noted that various modifications are possible with respect to individual steps. For example other deposition techniques can be selected in stead of those used in the example. The same holds for the materials selected. Thus, for example other insulating materials can be used like silicon oxynitride of various compositions and for the semiconductor material of the various regions silicon or a mixed crystal comprising silicon may be used.

Finally it is to be noted that the T-shaped contact structure used in the first example can also be applied advantageously in the second example.

The invention claimed is:

1. Method of manufacturing a semiconductor device with a substrate and a semiconductor body which is provided with at least one bipolar transistor having an emitter region, a base region and a collector region, wherein in the semiconductor body a first semiconductor region is formed that forms one of the collector and emitter regions and on the surface of the semiconductor body a stack of layers is formed comprising a first insulating layer, a polycrystalline semiconductor layer and a second insulating layer in which stack an opening is formed, after which by non-selective epitaxial growth a further semiconductor layer is deposited of which a monocrystalline horizontal part on the bottom of the opening forms the base region and of which a polycrystalline vertical part on a side face of the opening is connected to the polycrystalline semiconductor layer, after which spacers are formed parallel to the side face of the opening and a second semiconductor region is formed between said spacers forming the other one of the emitter and collector regions, characterized in that before the further semiconductor layer is deposited, the second insulating layer is provided with an end portion that viewed in projection overhangs an end portion of the underlying semiconductor layer.

2. Method according to claim 1, characterized in that the second insulating layer is provided with the overhanging end portion by removing a part of the end portion of the semiconductor layer after formation of the opening.

3. Method according to claim 1, characterized in that the lateral size of the overhanging portion and the thickness of the further semiconductor layer are chosen such that the vertical part of the further semiconductor layer is formed below the overhanging portion of the second insulating layer.

4. Method according to claim 3, characterized in that at least a part of the spacers is formed below the overhanging portion.

5. Method according to claim 1 characterized in that after deposition of the further semiconductor layer a sacrificial layer is deposited that covers the further semiconductor layer and completely fills the opening, after which upper portions of the sacrificial layer are removed by planarization, after which remaining horizontal polycrystalline portions of the further semiconductor layer are removed by etching and subsequently the sacrificial layer is removed by etching.

6. Method according to claim 5, characterized in that the other one of the emitter and collector regions is formed by growing another semiconductor layer which is patterned by photolithography and etching.

7. Method according to claim 1, characterized in that the region below the overhanging portion is laterally filled with the vertical polycrystalline part of the further semiconductor layer which vertical part subsequently is partly etched back by an etchant that etches polycrystalline material selective with respect to monocrystalline material thus again forming an end portion of the second insulating layer that viewed in projection overhangs an end portion of the underlying semiconductor layer.

8. Method according to claim 7, characterized in that immediately after the non-selective epitaxial growth of the further semiconductor layer, another semiconductor layer is deposited by non-selective epitaxial growth having a horizontal monocrystalline portion forming the other one of the emitter and collector regions and remaining polycrystalline portions.

9. Method according to claim 8, characterized in that the remaining polycrystalline portions of the another semiconductor layer are removed by the same selective etching step used to etch back the vertical polycrystalline part of the further semiconductor layer.

10. Method according to claim 1, characterized in that silicon is chosen as the material of various semiconductor regions and layers and that a mixed crystal of silicon and germanium is used for the further semiconductor layer.

11. Semiconductor device obtained by a method according to claim 1.

* * * * *